(12) United States Patent
Lee et al.

(10) Patent No.: US 7,699,957 B2
(45) Date of Patent: Apr. 20, 2010

(54) PLASMA PROCESSING APPARATUS

(75) Inventors: Seoung-Wook Lee, Hwaseong (KR); Young-Joo Hwang, Seoul (KR)

(73) Assignee: Advanced Display Process Engineering Co., Ltd., Sungnam-shi (KR)

( * ) Notice: Subject to any disclaimer, the term of this patent is extended or adjusted under 35 U.S.C. 154(b) by 165 days.

(21) Appl. No.: 11/711,612

(22) Filed: Feb. 28, 2007

(65) Prior Publication Data

US 2007/0204958 A1    Sep. 6, 2007

(30) Foreign Application Priority Data

Mar. 3, 2006  (KR) .................. 10-2006-0020599
Mar. 3, 2006  (KR) .................. 10-2006-0020614

(51) Int. Cl.
*C23F 1/00* (2006.01)
*C23C 16/00* (2006.01)

(52) U.S. Cl. .............. 156/345.31; 118/719; 156/914; 414/935

(58) Field of Classification Search .............. 156/914
See application file for complete search history.

(56) References Cited

U.S. PATENT DOCUMENTS

| | | | | |
|---|---|---|---|---|
| 4,423,891 A | * | 1/1984 | Menges | 285/305 |
| 4,572,759 A | * | 2/1986 | Benzing | 156/345.45 |
| 5,750,436 A | * | 5/1998 | Yamaga et al. | 438/558 |
| 6,063,198 A | * | 5/2000 | Bang et al. | 118/715 |
| 6,564,818 B2 | * | 5/2003 | Kroeker et al. | 137/15.23 |
| 2004/0149216 A1 | * | 8/2004 | Osada et al. | 118/723 E |
| 2005/0126488 A1 | * | 6/2005 | Ogasawara et al. | 118/723 E |
| 2006/0112879 A1 | * | 6/2006 | Lee et al. | 118/723 R |
| 2006/0182534 A1 | * | 8/2006 | Hiroki | 414/217 |

FOREIGN PATENT DOCUMENTS

| | | |
|---|---|---|
| JP | 2001-2241 | 1/2001 |
| JP | 2003-059910 | 2/2003 |

OTHER PUBLICATIONS

Korean Office Action dated Jan. 16, 2009.

* cited by examiner

*Primary Examiner*—Michael Cleveland
*Assistant Examiner*—Nathan K Ford
(74) *Attorney, Agent, or Firm*—KED & Associates, LLP (57) ABSTRACT

Disclosed is a plasma processing apparatus, in which parasitic plasma is not generated in a transfer chamber. The plasma processing apparatus has a load lock chamber, a transfer chamber, a processing chamber, and gate valves installed between the chambers for transferring a substrate and opening and closing openings of the chambers. Each of the gate valves includes a valve housing provided between the chambers such that the valve housing contacts side surfaces of the chambers by interposing sealing members therebetween, and forming a designated closed space therein; a valve including a sealing plate contacting an inner surface of the valve housing on the side of the processing chamber, and a back plate contacting the inner surface of the valve housing on the side of the transfer chamber; a valve driving unit connected to the valve for moving the valve in the vertical direction; and a ground member formed on the surface of the valve for electrically connecting the valve and the valve housing when the valve contacts the inner surface of the valve housing.

24 Claims, 7 Drawing Sheets

PLASMA PROCESSING APPARATUS

BACKGROUND OF THE INVENTION

1. Field of the Invention

The present invention relates to a plasma processing apparatus, and more particularly to a plasma processing apparatus, in which parasitic plasma is not generated in a transfer chamber.

2. Description of the Related Art

Generally, plasma processing apparatuses are used to process a substrate, such as etching, for flat panel displays, which is supplied thereto, using plasma. The flat panel displays include liquid crystal displays, plasma display panels, or organic light emitting diodes. Among these plasma processing apparatuses, a vacuum processing apparatus generally includes three chambers, i.e., a load lock chamber, a transfer chamber, and a processing chamber.

The load lock chamber serves to receive a non-processed substrate from the outside or discharge a processed substrate to the outside alternately in an atmospheric state and a vacuum state. The transfer chamber is provided with a transfer robot for transferring a substrate between the other chambers, and serves to convey a substrate to be processed, from the load lock chamber to the processing chamber or a processed substrate from the processing chamber to the load lock chamber. The processing chamber serves to deposit a film on a substrate or etch a substrate using plasma in a vacuum.

The processing chamber is provided with electrodes installed at the upper and lower parts of the inside thereof. Generally, one electrode of the processing chamber is connected to a RF power source, and the other electrode of the processing chamber is grounded. When RF power is applied to the inside of the processing chamber under the condition that a processing gas is injected into the processing chamber, plasma is generated in the processing chamber due to electric discharge, and a substrate is processed using the plasma.

Figure 1:
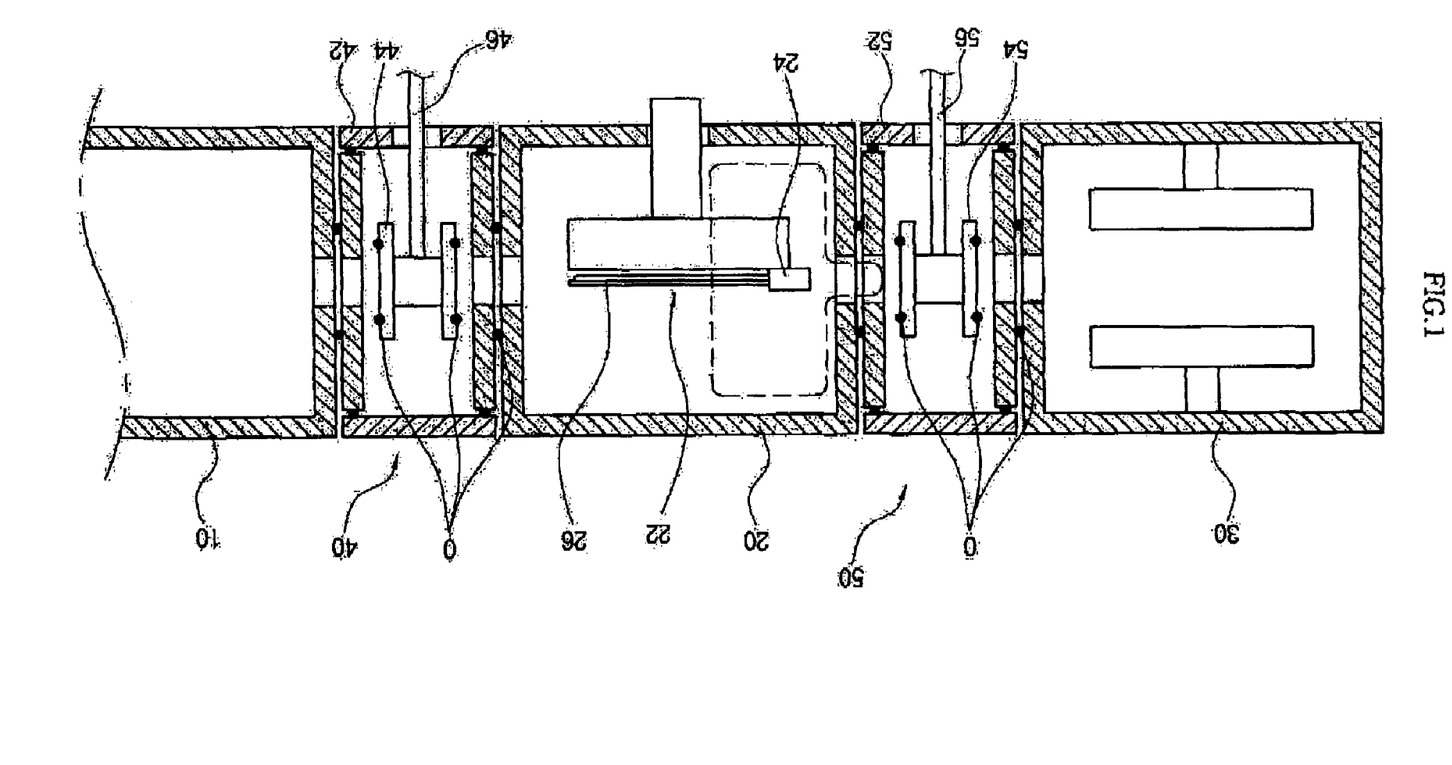
FIG. 1 is a sectional view of a conventional plasma processing apparatus.

As shown in FIG. 1, a conventional plasma processing apparatus includes a load lock chamber 10, a transfer chamber 20, and a processing chamber 30. Gate valves 40 and 50 are provided between the load lock chamber 10 and the transfer chamber 20 and between the transfer chamber 20 and the processing chamber 30 under the condition that the gate valves 40 and 50 are adjacent to the corresponding chambers 10, 20, and 30.

The gate valve 40 is interposed between the load lock chamber 10 and the transfer chamber 20, and serves to open and close a communication channel therebetween. The gate valve 50 is interposed between the transfer chamber 20 and the processing chamber 30, and serves to open and close a communication channel therebetween. The gate valves 40 and 50 include valve housings 42 and 52, valves 44 and 54, and valve driving units 46 and 56.

The airtightness of the valve housing 42 between the load lock chamber 10 and the transfer chamber 20 is maintained by airtightness maintaining members (O), and the airtightness of the valve housing 52 between the transfer chamber 20 and the processing chamber 30 is maintained by airtightness maintaining members (O).

Plates for opening and closing openings of the load lock chamber 10 and the transfer chamber 20 by means of the valve driving unit 46 are provided in the valve housing 42, and plates for opening and closing openings of the transfer chamber 20 and the processing chamber 30 by means of the valve driving unit 56 are provided in the valve housing 52.

The transfer chamber 20 is provided with a transfer robot 22 installed therein for transferring a substrate (not shown) to the load lock chamber 10 or the processing chamber 30. The transfer robot 22 includes a transfer arm and a driving unit (not shown). The transfer arm includes an end effector assembly 24, and an end effector 26 connected to the end effector assembly 24 for transferring the substrate.

Generally, chambers are made of aluminum. However, the transfer chamber 20 is made of steel use stainless (SUS) due to strength to weight ratio and increase in volume corresponding to the size of a substrate.

Figure 2:
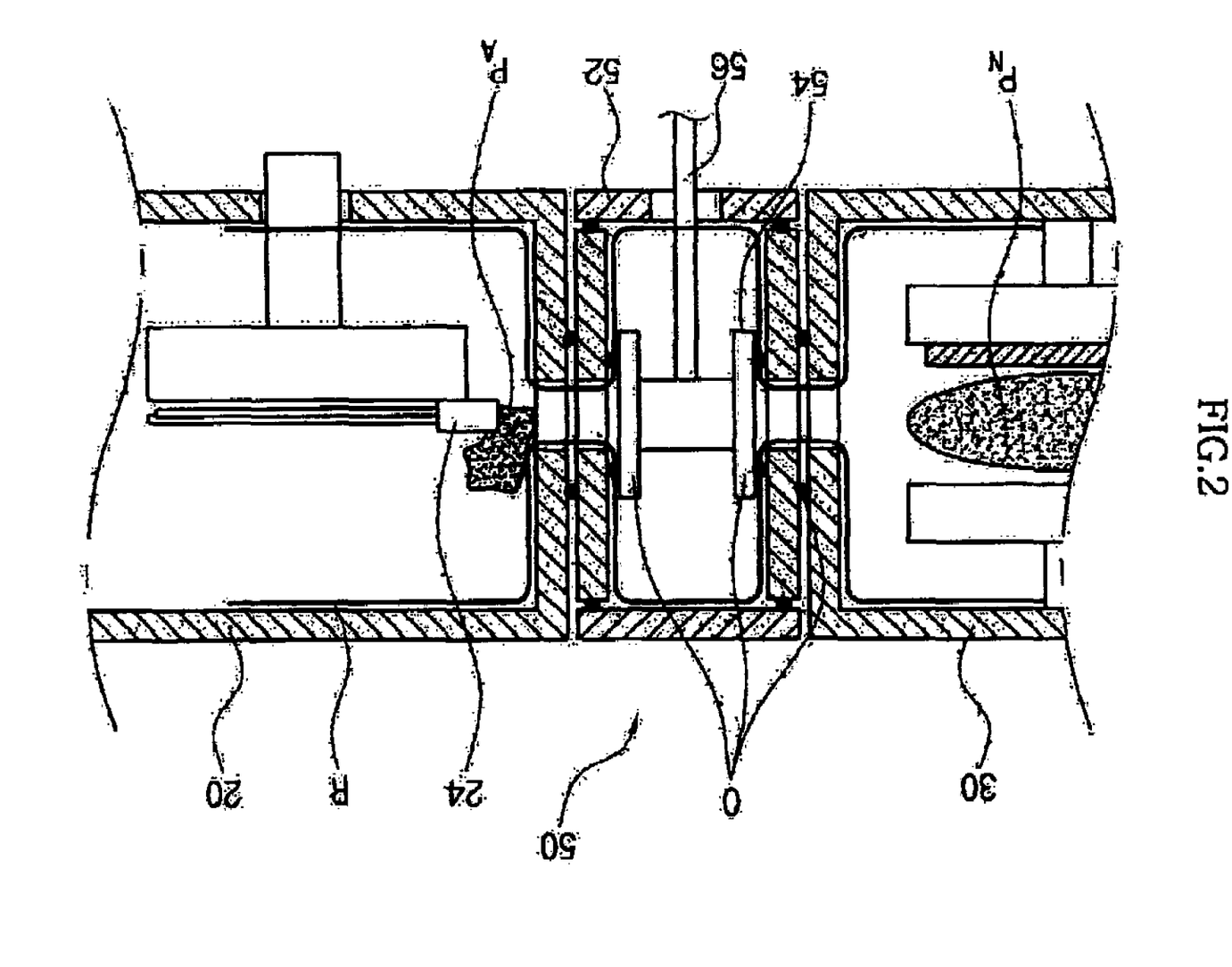
FIG. 2 is a sectional view of the conventional plasma processing apparatus in a state, in which RF power is induced.

The transfer chamber 20 made of SUS, which has specific resistance differing from that of aluminum, is not easily grounded. When the transfer chamber 20 is not completely grounded, as shown in FIG. 2, RF power (R) in the processing chamber 30 is not exhausted to the outside, but is induced in the transfer chamber 20. When the RF power (R) is induced in the transfer chamber 20, the wall of the transfer chamber 20 does not reach a complete grounding potential state, and the wall of the transfer chamber 20 and the corner portion of the end effector assembly 24 having a grounding potential, which is disposed close to the wall of the transfer chamber 20, are coupled, thus generating parasitic plasma ($P_A$).

When parasitic plasma ($P_A$) is generated in the transfer chamber 20, many problems occur. That is, processing characteristics are changed due to an RF power loss, particles are increased due to damage to ions in the transfer chamber 20, static electricity of a substrate is generated due to charging of the inside of the transfer chamber 20 or the transfer robot 22, and the transfer robot 22 malfunctions due to the pseudo noise of RF.

SUMMARY OF THE INVENTION

Therefore, the present invention has been made in view of the above problems, and it is an object of the present invention to provide a plasma processing apparatus, in which parasitic plasma is not generated in a transfer chamber.

In accordance with the present invention, the above and other objects can be accomplished by the provision of a plasma processing apparatus having a load lock chamber, a transfer chamber, a processing chamber, and gate valves installed between the chambers for transferring a substrate and opening and closing openings of the chambers, each of the gate valves comprises a valve housing provided between the chambers such that the valve housing contacts side surfaces of the chambers by interposing sealing members therebetween, and forming a designated closed space therein; a valve including a sealing plate contacting an inner surface of the valve housing on the side of the processing chamber, and a back plate contacting the inner surface of the valve housing on the side of the transfer chamber; a valve driving unit connected to the valve for moving the valve in the vertical direction; and a ground member formed on the surface of the valve for electrically connecting the valve and the valve housing when the valve contacts the inner surface of the valve housing.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 3:
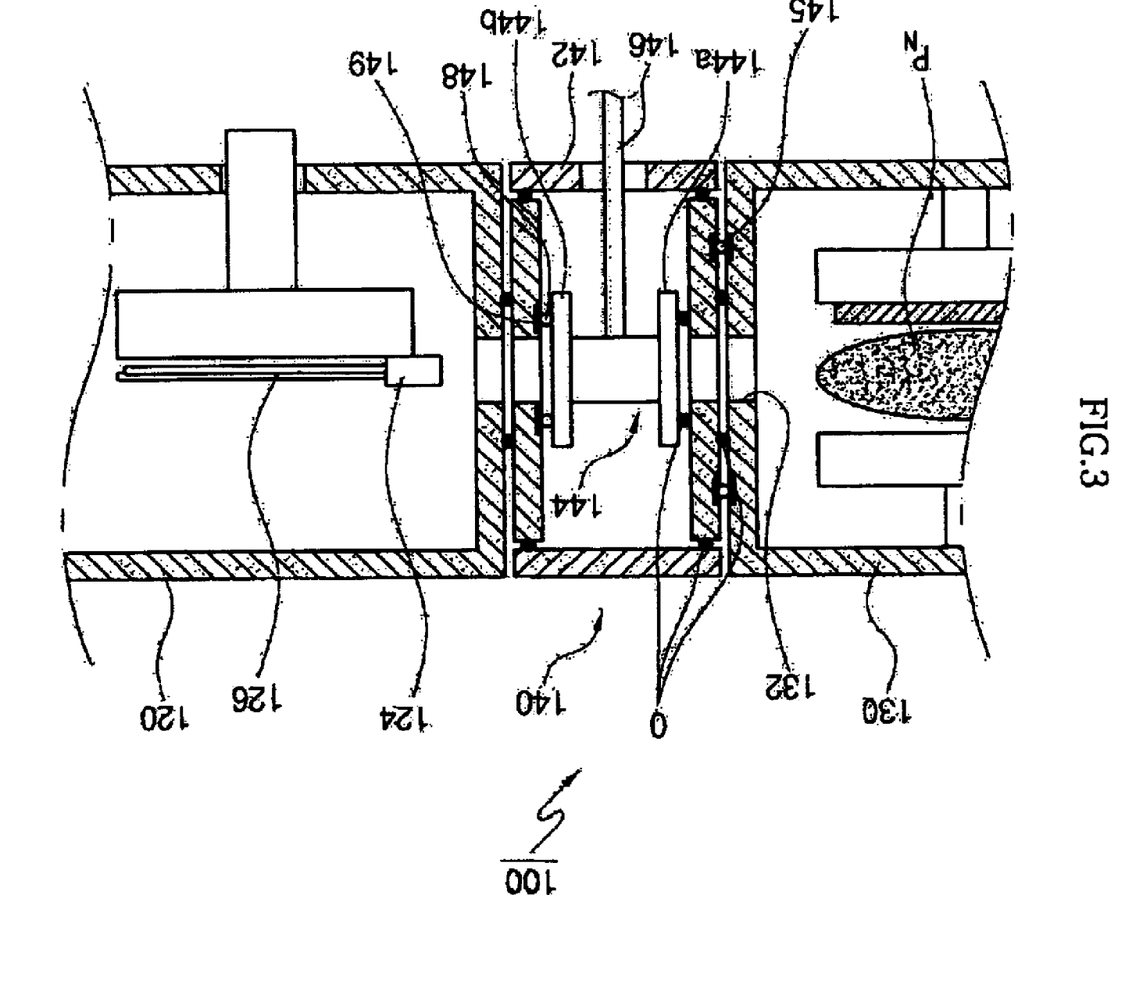
FIG. 3 is a sectional view of a plasma processing apparatus in accordance with one embodiment of the present invention.

As shown in FIG. 3, a plasma processing apparatus 100 in accordance with one embodiment of the present invention includes a load lock chamber (not shown), a transfer chamber 120, a processing chamber 130, and gate valves 140 provided between the neighboring chambers for opening and closing openings of the chambers. Structures and functions of all the chambers are substantially the same as those of the corresponding chambers of the conventional plasma processing apparatus, and a detailed description thereof will be thus omitted.

Each of the gate valves 140, as shown in FIG. 3, includes a valve housing 142, a valve 144, a valve driving unit 146, and a ground member 148.

The valve housing 142 is provided in a space formed between the neighboring chambers, and forms an airtight space having a designated size. The valve 144 is located in the airtight space. Sealing members (O) are interposed between the valve housing 142 and the side surfaces of the chambers, thus maintaining the airtightness of the gate valve 140 between the chambers.

The valve 144 is installed in the valve housing 142, and opens and closes an opening 132 of the processing chamber 130. The valve 144 includes a sealing plate 144a and a back plate 144b. The sealing plate 144a contacts the inner surface of the valve housing 142 on the side of the processing chamber 130, and thus serves to open and close the opening 132 of the processing chamber 130. The back plate 144b contacts the inner surface of the valve housing 142 on the side of the transfer chamber 120, and thus serves to support the valve 144 so as to assist the sealing plate 144a to firmly close the opening 132 of the processing chamber 130.

The valve driving unit 146, as shown in FIG. 3, is connected to the lower portion of the valve 144, and the lower end of the valve driving unit 146 passes through the lower wall of the valve housing 142 and is connected to a separate driving source (not shown) provided at the outside of the chambers. The valve driving unit 146 serves to drive the valve 144 up and down. More specifically, the valve driving unit 146 drives the valve 144 up and down to open and closes the opening 132 of the processing chamber 130 and the opening of the valve housing 142. In order to firmly close the openings, the valve 144 moves horizontally toward the processing chamber 130, and applies a pressure having a designated strength to the processing chamber 130. Accordingly, the valve driving unit 146 moves the valve 144 horizontally as well vertically by a constant force.

Figure 7A:
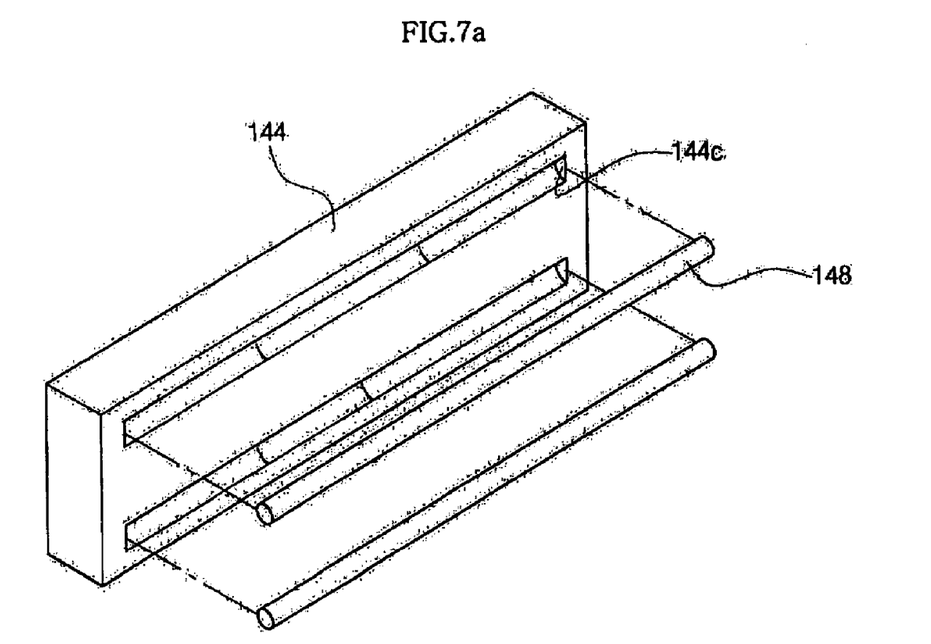
FIG. 7A to 7C are perspective views illustrating various modifications of the ground member in accordance with one embodiment of the present invention.
Figure 7B:
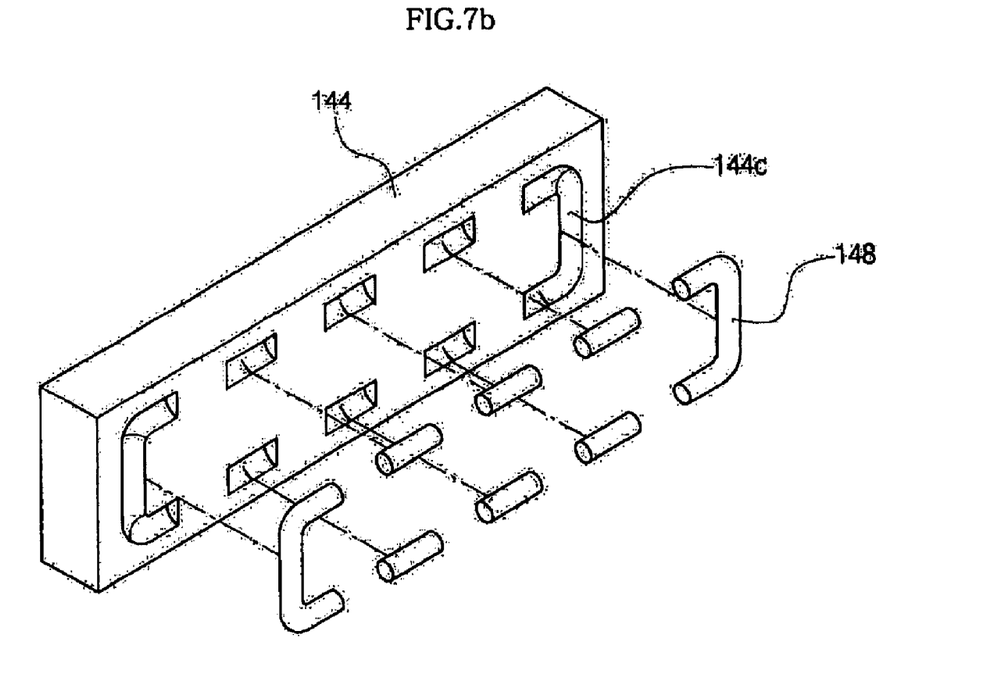
Figure 7C:
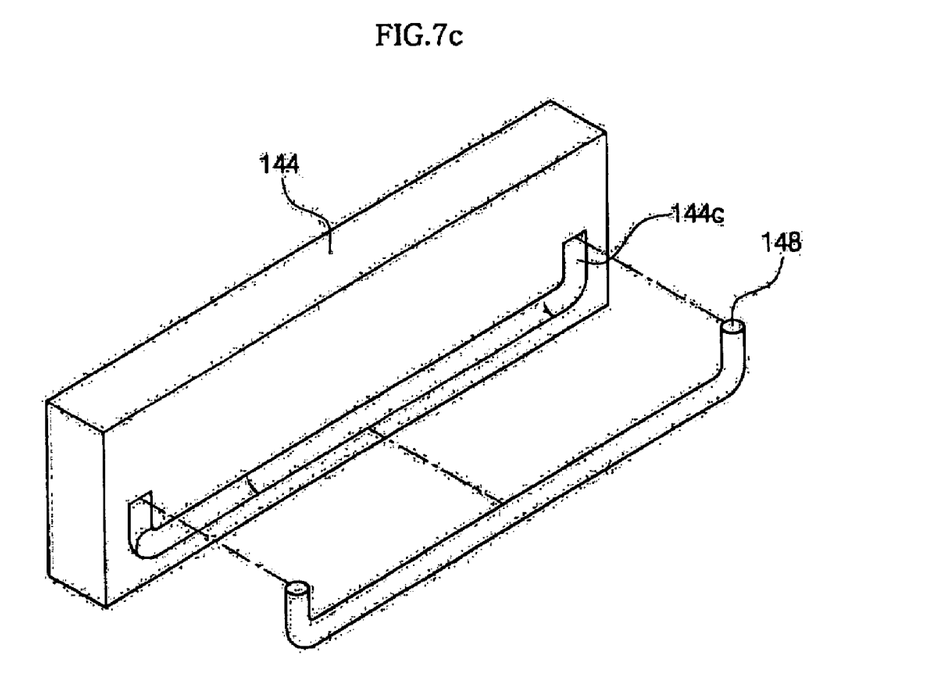

The ground member 148 is formed on the surface of the valve 144, and electrically connects the valve 144 and the valve housing 142 when the valve 144 contacts the inner surface of the valve housing 142. That is, the ground member 148 electrically connects the valve 144 and the valve housing 142, thus preventing RF power (R) from being transferred to the transfer chamber 120. Due to the use of the ground member 148, as shown in FIGS. 7A to 7C, a closed circuit among the processing chamber 120, the valve housing 142, and the valve 144, is formed, and thus the RF power (R) cannot be transferred to the transfer chamber 120 but is exhausted to the outside through a grounding portion.

In this embodiment, the ground member 148 may be disposed at the edge of the back plate 144b or the edge of the sealing plate 144a. Preferably, the ground member 148 is disposed at the edge of the back plate 144b so as to effectively prevent the RF power from being transferred to the transfer chamber 120.

Figure 4:
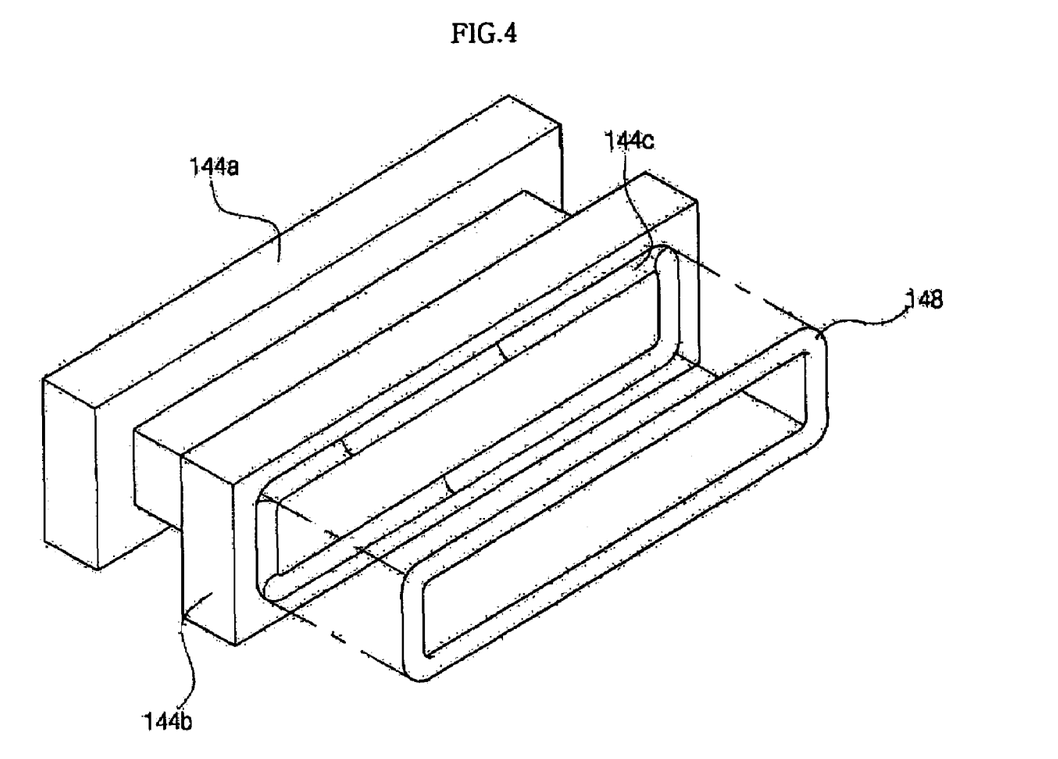
FIG. 4 is an exploded perspective view illustrating the disposition structure of a ground member in accordance with one embodiment of the present invention.
Figure 5:
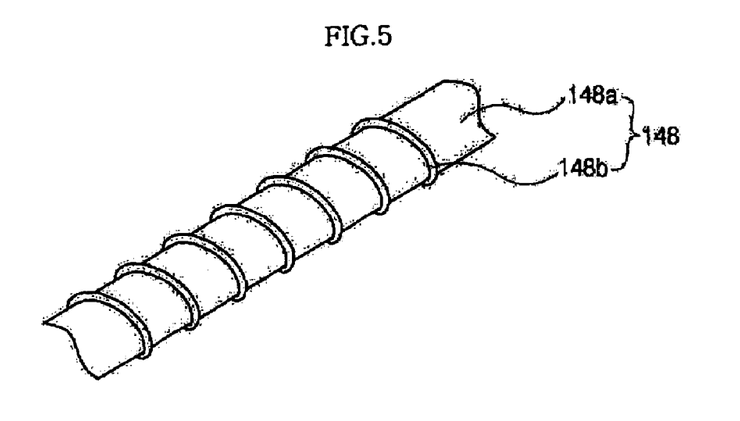
FIG. 5 is a perspective view illustrating the disposition structure of a ground member in accordance with another embodiment of the present invention.

Further, in this embodiment, the ground member 148 may be an O-ring made of a conductive material. Preferably, a fixing groove 144c, into which the ground member 148 is inserted, is formed in the edge of the back plate 144b or the sealing plate 144a, as shown in FIG. 4. Otherwise, the ground member 148 may be a spiral ring made of a metal. However, the spiral ring has poor elasticity, and thus cannot be easily restored to its original state after it is deformed due to the movement of the valve 144. Accordingly, more preferably, the ground member 148 includes an O-ring 148a made of a conductive material or a general material and a wire 148b made of a metal and wound on the outer surface of the O-ring 148a, as shown in FIG. 5.

Preferably, a contact surface is formed on a portion of the inner surface of the valve housing 142 contacting the ground member 148 by removing an anodizing film from the inner surface of the valve housing 142, as shown in FIG. 3. The valve housing 142 is generally made of aluminum, and the surface of the valve housing 142 is anodized. Thereby, the anodizing film is formed on the surface of the valve housing 142. Accordingly, the surface of the valve housing 142 has poor electrical conductivity. Therefore, the contact surface is formed by removing the anodizing film from the portion of the valve housing 142 contacting the ground member 148, thus exposing aluminum. Further, preferably, a groove having a shape corresponding to that of the ground member 148 is formed in the contact surface so as to increase a contact area with the ground member 148 and stably contact the ground member 148.

Bare aluminum without the anodizing film formed thereon has poor strength, and thus generates particles when it contacts the ground member 148. Accordingly, preferably, a bracket 149 made of a metal having higher strength than that of aluminum is provided on the contact surface or the groove. That is, as shown in FIG. 3, the inner surface of the portion of the valve housing 142 contacting the ground member 148 is removed to a designated depth, and the bracket 149 made of a metal having high strength is attached to the portion of the valve housing 142 contacting the ground member 148, thus preventing the generation of particles. The bracket 149 is made of a metal, which has higher strength than that of aluminum and excellent electrical conductivity. Preferably, the bracket 149 is made of one selected from the group consisting of stainless steel, Ti, and W.

In this embodiment, preferably, an electrical connecting member 145 for electrically connecting the valve housing 142 and the processing chamber 130 is provided between the valve housing 142 and the processing chamber 130, as shown in FIG. 3. Since a plasma processing apparatus for manufacturing LCDs generally uses RF power of high voltage, although such an electrical connecting member is not provided, the RF power can flow to a valve housing. However, when the electrical connecting member 145 is provided, the RF power (R) flows to the valve housing 142 through a complete closed circuit and is exhausted to the outside. Preferably, a spiral ring made of a metal, which stably connects the processing chamber 130 and the valve housing 142, is used as the electrical connecting member 145.

Preferably, a contact surface is formed on a portion of the wall of the processing chamber 130 or the valve housing 142 contacting the electrical connecting member 145 by removing the anodizing film from the surface of the processing chamber 130 or the valve housing 142, as shown in FIG. 3, thus completely electrically connecting the processing chamber 130 and the valve housing 142. Further, a bracket may be formed on the contact surface.

Figure 6:
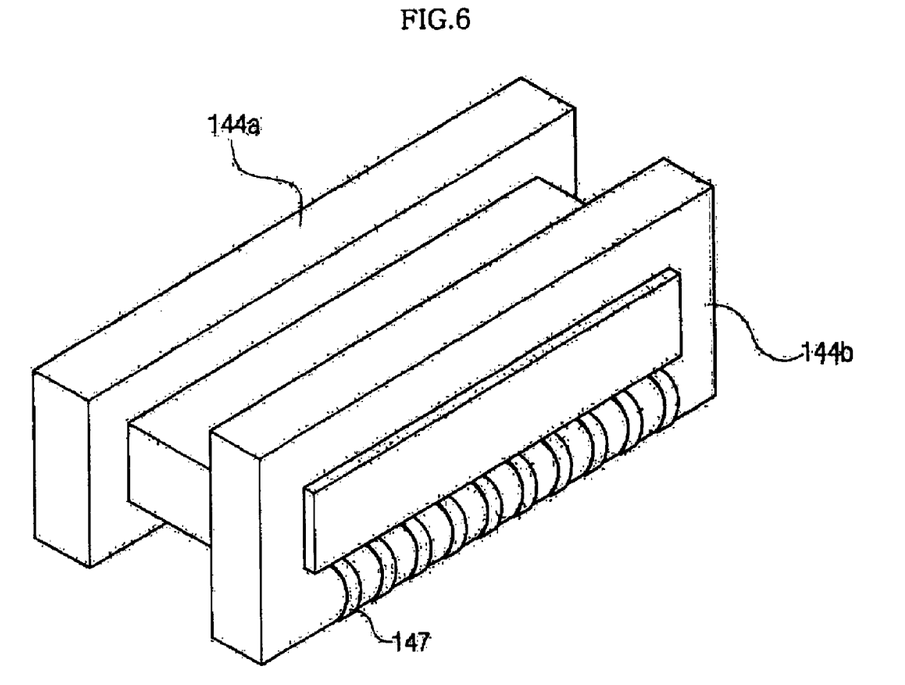
FIG. 6 is a perspective view illustrating the disposition structure of a ground reinforcing member in accordance with one embodiment of the present invention.

In this embodiment, as shown in FIG. 6, a ground reinforcing member 147 for electrically connecting the lower surface of the valve 144 and the lower surface of the valve housing 142 is provided on the valve 144 so as to completely connect the valve 144 to the ground surface, thereby effectively exhausting the RF power to the outside. Preferably, the ground reinforcing member 147 is an aluminum strap having elasticity, which stably connects the valve 144 and the valve housing 142 in spite of the vertical movement of the valve 144. That is, as the valve 144 moves vertically, the aluminum strap is compressed and stretched, thus continuously connecting the valve 144 and the valve housing 142.

In another embodiment of the present invention, in order to prevent particles from dropping on a substrate passing through the opening of the valve housing 142, the ground member 148 is formed only at a portion of the edge of the valve 144. That is, as shown in FIG. 7A, the ground member 148 may be disposed at upper and lower portions of the valve 144, and be not disposed at side portions of the valve. As shown in FIG. 7B, the ground member 148 may be not continuously disposed, but be partially cut. As shown in FIG. 7C, the ground member 148 may be disposed only at lower and side portions of the valve 144. Most preferably, as shown in FIG. 7C, the ground member 148 is disposed only at lower and side portions of the valve 144, because there is little possibility that generated particles drop on a substrate.

In this embodiment, the ground member 148 is disposed only at a portion of the edge of the valve 144 corresponding to 10~99% of the whole area of the edge of the valve 144. When the ground member 148 is disposed at a portion of the edge of the valve 144 corresponding to 10% or less of the whole area of the edge of the valve 144, grounding capacity is lowered. On the other hand, when the ground member 148 is disposed at a portion of the edge of the valve 144 corresponding to 99% or more of the whole area of the edge of the valve 144, particles are generated.

The valve 144 in accordance with this embodiment, as shown in FIG. 3, includes the sealing plate 144a contacting the inner surface of the valve housing 142 on the side of the processing chamber 130, and the back plate 144b contacting the inner surface of the valve housing 142 on the side of the transfer chamber 120. Preferably, the ground member 148 is disposed at the edge of the back plate 144b so as to effectively exhaust RF power from the valve housing 142 to the outside.

On the other hand, the valve 144 may include only the sealing plate 144a contacting the inner surface of the valve housing 142 on the side of the processing chamber 130 for opening and closing the opening 132 of the processing chamber 130. In this case, preferably, the ground member 148 is disposed at the edge of the sealing plate 144a to form a closed circuit.

In this embodiment, the ground member 148 may be an O-ring made of a conductive material. Preferably, a fixing groove 144c, into which the ground member 148 is inserted, is formed in the edge of the valve 144. Otherwise, the ground member 148 may be a spiral ring made of a metal. However, the spiral ring has poor elasticity, and thus cannot be easily restored to its original state after it is deformed due to the movement of the valve 144. Accordingly, more preferably, the ground member 148 includes an O-ring 148a made of a conductive material or a general material and a wire 148b made of a metal and wound on the outer surface of the O-ring 148a, as shown in FIG. 5.

Figure 8:
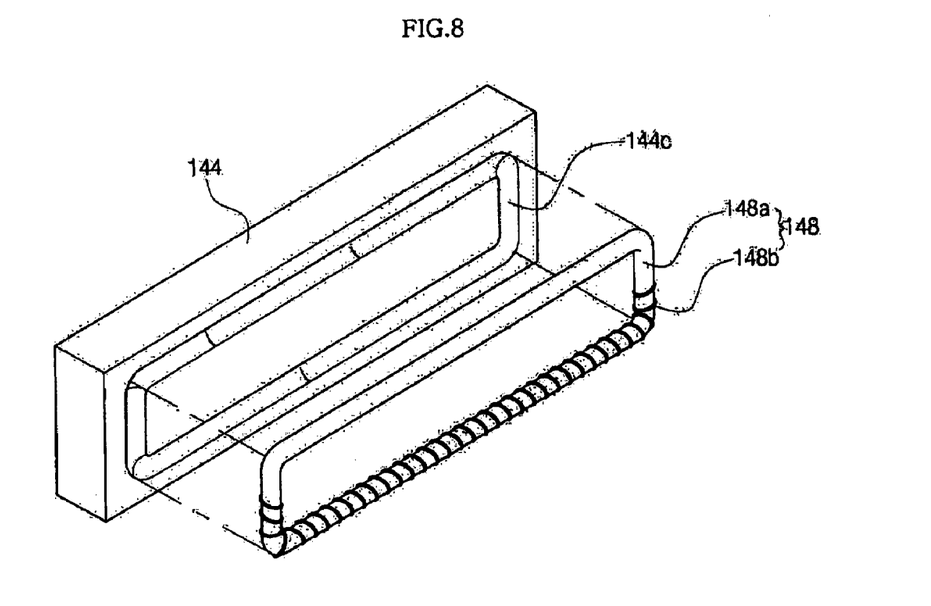
FIG. 8 is a perspective view illustrating the disposition structure of a ground member in accordance with another embodiment of the present invention.

Therefore, in this embodiment, as shown in FIG. 8, the ground member 148 has a structure in which an O-ring 148a made of a general material is disposed at the edge of the valve 144 and a spiral ring 148b made of a metal is wound on the outer surface of the O-ring 148a only at the lower and side portions of the valve 144. The anodizing film remains on a portion of the valve housing 142 corresponding to the upper portion of the ground member 148. On the other hand, the anodizing film is removed from portions of the valve housing 142 corresponding to the side and lower portions of the ground member 148, thus forming a groove. Then, metals do not contact each other at the upper portion of the valve 144, thus not generating particles. Further, although metals contact each other at the side and lower portions of the valve 144, generated particles move downwardly and thus do not drop on a substrate so as not to contaminate the substrate.

On the other hand, the ground member 148 may have a structure in which an O-ring made of a conductive material is disposed at the edge of the valve and a spiral ring made of a metal is wound on the outer surface of the O-ring only at the lower and side portions of the valve. The anodizing film is removed from a portion of the valve housing 142 corresponding to the ground member 148, thus forming a groove. Then, the spiral ring made of a metal is not disposed at the upper portion of the valve 144, thus not generating particles. However, the ground member 148 uses the O-ring made of a conductive material, and thus has improved conductivity.

Figure 9:
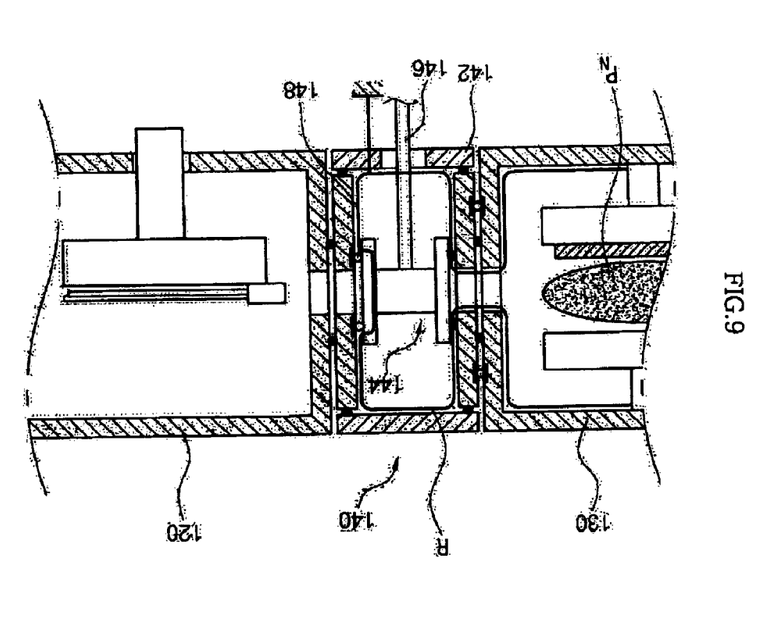
FIG. 9 is a schematic view illustrating a circuit, in which RF power flows, in a plasma processing apparatus in accordance with one embodiment of the present invention.

As described above, when the ground member 148 is disposed on the valve 144, as shown in FIG. 9, a complete closed circuit is formed between the processing chamber 130 and the valve housing 142, and the RF power (R) leaked to the valve housing 142 is completely exhausted to the outside of the valve housing 142 through a grounding terminal. Accordingly, the RF power (R) is not induced in the transfer chamber 120, and parasitic plasma is not generated in the transfer chamber 120.

As apparent from the above description, the present invention provides a plasma processing apparatus, in which RF power is not transferred to a transfer chamber so as not to generate parasitic plasma in the transfer chamber, particularly between a transfer robot and the transfer chamber.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A plasma processing apparatus having a load lock chamber, a transfer chamber, a processing chamber, and gate valves respectively installed between the chambers, each of the gate valves comprising:
   a valve housing provided between the chambers such that external side surfaces of the valve housing contact corresponding external side surfaces of the chambers via sealing members positioned therebetween, wherein the valve housing defines a closed space therein;
   a valve provided in the valve housing, the valve including a sealing plate that contacts a corresponding inner surface of the valve housing on a side thereof adjacent to the processing chamber, and a back plate that contacts a corresponding inner surface of the valve housing on a side thereof adjacent to the transfer chamber;
   a valve driver coupled to the valve, wherein the valve driver moves the valve in a vertical direction; and
   a ground member having a closed curve shape, wherein the ground member is positioned along an edge of the sealing plate opposite the corresponding inner surface of the valve housing, or along an edge of the back plate opposite the corresponding inner surface of the valve housing so as to ground the gate valve, and
   wherein the ground member comprises an O-ring made of a conductive material, and a spiral ring made of a metal that is wound around an outer surface of the O-ring.

2. The plasma processing apparatus according to claim 1, further comprising a contact surface formed on the inner surface of the valve housing that contacts the ground member, wherein an anodizing film on the inner surface of the valve housing is removed on the contact surface.

3. The plasma processing apparatus according to claim 2, further comprising a groove formed in the inner surface of the valve housing that contacts the ground member, wherein a shape of the groove corresponds to a shape of the ground member so as to receive the ground member therein.

4. The plasma processing apparatus according to claim 3, further comprising a bracket provided on the contact surface, wherein the bracket is made of a metal having a higher strength than that of aluminum.

5. The plasma processing apparatus according to claim 4, wherein the bracket is made of stainless steel, Ti or W.

6. The plasma processing apparatus according to claim 1, further comprising an electrical connecting member provided between the valve housing and the processing chamber so as to electrically connect the valve housing and the processing chamber.

7. The plasma processing apparatus according to claim 6, wherein the electrical connecting member is a spiral ring made of a metal.

8. The plasma processing apparatus according to claim 6, further comprising a contact surface formed on one of the outer surface of the processing chamber or the outer surface of the valve housing that contacts the electrical connecting member, wherein an anodizing film on the one of the outer surface of the processing chamber or the valve housing is removed at the contact surface.

9. The plasma processing apparatus according to claim 1, further comprising a ground reinforcing member that electrically connects a lower surface of a valve and the lower surface of the valve housing.

10. The plasma processing apparatus according to claim 9, wherein the ground reinforcing member comprises an aluminum strap having elasticity wound around a rod shaped lower portion of the valve.

11. A plasma processing apparatus having a load lock chamber, a transfer chamber, a processing chamber, and gate valves installed between the chambers, each of the gate valves comprising:
   a valve housing provided between the chambers such that outer side surfaces of the valve housing contact corresponding outer side surfaces of the chambers via sealing members positioned therebetween, wherein the valve housing forms a closed space therein;
   a valve positioned so as to open and close an opening into the processing chamber;
   a valve driver connected to the valve, wherein the valve driver moves the valve in a vertical direction; and
   a ground member provided on a surface of the valve so as to electrically connect the valve and the valve housing when the valve contacts a corresponding inner surface of the valve housing, wherein the ground member extends along an edge portion of the valve so as to prevent particles from dropping onto a substrate passing through the opening into the processing chamber, and
   wherein the ground member is made of a conductive material and comprises a spiral ring made of metal that is wound on an outer surface of an O-ring.

12. The plasma processing apparatus according to claim 11, wherein the valve includes a sealing plate that contacts a corresponding inner surface of the valve housing adjacent to the processing chamber, and a back plate that contacts a corresponding inner surface of the valve housing adjacent to the transfer chamber, and wherein the ground member extends along an edge of the back plate.

13. The plasma processing apparatus according to claim 12, wherein the ground member extends along an edge of the back plate on a surface of the back plate that faces the corresponding inner surface of the valve housing adjacent to the transfer chamber.

14. The plasma processing apparatus according to claim 12, wherein the ground member is extends along side and lower edge portions of the sealing plate, or along side and lower edge portions of the back plate.

15. The plasma processing apparatus according to claim 11, wherein the valve includes a sealing plate that contacts a corresponding inner surface of the valve housing adjacent to the processing chamber, and the ground member extends along an edge of the sealing plate.

16. The plasma processing apparatus according to claim 15, wherein the ground member extends along an edge of the sealing plate on a surface of the sealing plate that faces the corresponding inner surface of the valve housing adjacent to the processing chamber.

17. The plasma processing apparatus according to claim 11, wherein the ground member extends along an edge portion of the valve that corresponds to 10~99% of a whole edge area of the valve.

18. The plasma processing apparatus according to claim 11, further comprising a groove formed in a portion of the surface of the valve that contacts the ground member, wherein the groove is formed in an area in which an anodizing fim has been removed from the surface of the valve so as to improve electrical contact properties with the ground member.

19. The plasma processing apparatus according to claim 18, wherein a bracket made of a metal having ahigher strength than that of aluminum is provided on the groove.

20. The plasma processing apparatus according to claim 19, wherein the bracket is made of stainless steel, Ti or W.

21. The plasma processing apparatus according to claim 11, further comprising a groove formed in a portion of the surface of the valve housing that contacts the ground member, wherein the groove is formed in an area in which an anodizing film has been removed from the surface of the valve so as to improve electrical contact properties with the ground member.

22. The plasma processing apparatus according to claim 11, wherein the O-ring is positioned at the edge of the valve with the spiral ring made of a metal wound on an outer surface of side and lower portions of the O-ring; and wherein an anodizing film remains on a portion of the valve housing corresponding to the upper portion of the ground member, and is removed from portions of the valve housing corresponding to the side and lower portions of the ground member so as to form a groove.

23. The plasma processing apparatus according to claim 11, wherein the ground member comprises an O-ring made of a conductive material positioned at the edge of the valve, with a spiral ring made of a metal wound on an outer surface of side and lower portions of the O-ring, and wherein an anodizing film is removed from a portion of the valve housing corresponding to the ground member so as to form a groove in which the ground member is received.

24. A plasma processing apparatus having a load lock chamber, a transfer chamber, a processing chamber, and gate valves installed between the chambers, each of the gate valves comprising:
a valve housing provided between the chambers such that outer side surfaces of the valve housing contact corresponding outer side surfaces of the chambers via sealing members positioned therebetween, wherein the valve housing forms a closed space therein;
a valve disposed in the valve housing so as to open and close an opening into the transfer chamber or the process chamber;
a valve driver connected to the valve so as to move the valve in a vertical direction; and
a ground member provided on a surface of the valve which contacts an inner surface of the valve housing so as to ground the gate valve, wherein the ground member comprises an O-ring made of a conductive material, and a spiral ring made of a metal that is wound around an outer surface of the O-ring.

* * * * *